United States Patent
Nanjundappa et al.

(10) Patent No.: US 9,754,071 B1
(45) Date of Patent: Sep. 5, 2017

(54) INTEGRATED CIRCUIT (IC) DESIGN ANALYSIS AND FEATURE EXTRACTION

(71) Applicant: GLOBALFOUNDRIES INC., Grand Cayman (KY)

(72) Inventors: Haraprasad Nanjundappa, Beacon, NY (US); Basanth Jagannathan, Hopewell Junction, NY (US); Laura S. Chadwick, Essex Junction, VT (US); Dureseti Chidambarrao, Weston, CT (US); Christopher V. Baiocco, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/048,066

(22) Filed: Feb. 19, 2016

(51) Int. Cl.
*G06F 17/50* (2006.01)

(52) U.S. Cl.
CPC ................................ *G06F 17/5081* (2013.01)

(58) Field of Classification Search
USPC .................................................. 716/110–116
See application file for complete search history.

(56) References Cited

U.S. PATENT DOCUMENTS

| 5,206,582 A | 4/1993 | Ekstedt et al. |
|---|---|---|
| 6,587,997 B1 | 7/2003 | Chen et al. |
| 7,783,999 B2 | 8/2010 | Ou et al. |
| 2008/0003510 A1* | 1/2008 | Harazaki ............... G03F 1/36 430/5 |
| 2011/0219344 A1* | 9/2011 | Heng ..................... G06F 17/50 716/103 |
| 2014/0189623 A1* | 7/2014 | Chen ................. G06F 17/5009 716/107 |
| 2014/0380258 A1 | 12/2014 | Hours et al. |

* cited by examiner

*Primary Examiner* — Binh Tat
(74) *Attorney, Agent, or Firm* — Michael LeStrange; Hoffman Warnick LLC

(57) ABSTRACT

Various embodiments include approaches for analyzing integrated circuit (IC) designs. In some cases, an approach includes: defining extraction parameters for the design of the IC for each of a set of failure modes; testing the design of the IC for a failure mode in the set of failure modes; identifying a defined extraction parameter from the design of the IC for at least one of the set of failure modes; correlating the identified defined extracted parameter and each of the at least one failure mode for the design of the IC; and creating a normalized parameter equation representing the correlation of the identified defined extraction parameter with the at least one failure mode for the design of the IC in numerical form.

18 Claims, 3 Drawing Sheets

INTEGRATED CIRCUIT (IC) DESIGN ANALYSIS AND FEATURE EXTRACTION

FIELD

The subject matter disclosed herein relates to integrated circuits. More particularly, the subject matter disclosed herein relates to design and analysis of integrated circuits.

BACKGROUND

Analyzing the electrical readout from an integrated circuit (IC) test structure requires a deep understanding of the IC design and normalization methods, which is significant to understanding defects and project yield metrics for that design. However, normalizing test structure data and test condition data for an IC design is manually intensive, and can result in significant time delays in refining and building the IC from that design.

BRIEF DESCRIPTION

Various embodiments of the disclosure include approaches for analyzing an integrated circuit (IC) layout. In some cases, an approach includes: defining extraction parameters for the design of the IC for each of a set of failure modes; testing the design of the IC for a failure mode in the set of failure modes; identifying a defined extraction parameter from the design of the IC for at least one of the set of failure modes; correlating the identified defined extracted parameter and each of the at least one failure mode for the design of the IC; and creating a normalized parameter equation representing the correlation of the identified defined extraction parameter with the at least one failure mode for the design of the IC in numerical form.

A first aspect of the disclosure includes a system having: at least one computing device configured to analyze a design of an integrated circuit (IC) by performing actions including: defining extraction parameters for the design of the IC for each of a set of failure modes; testing the design of the IC for a failure mode in the set of failure modes; identifying a defined extraction parameter from the design of the IC for at least one of the set of failure modes; correlating the identified defined extracted parameter and each of the at least one failure mode for the design of the IC; and creating a normalized parameter equation representing the correlation of the identified defined extraction parameter with the at least one failure mode for the design of the IC in numerical form.

A second aspect of the disclosure includes a computer program product having program code stored on a computer-readable storage medium, which when executed by at least one computing device, causes the at least one computing device to analyze a design of an integrated circuit (IC) by performing actions including: defining extraction parameters for the design of the IC for each of a set of failure modes; testing the design of the IC for a failure mode in the set of failure modes; identifying a defined extraction parameter from the design of the IC for at least one of the set of failure modes; correlating the identified defined extracted parameter and each of the at least one failure mode for the design of the IC; and creating a normalized parameter equation representing the correlation of the identified defined extraction parameter with the at least one failure mode for the design of the IC in numerical form.

A third aspect of the disclosure includes a computer program product having program code stored on a computer-readable storage medium, which when executed by at least one computing device, causes the at least one computing device to analyze a design of an integrated circuit (IC) by performing actions including: defining extraction parameters for the design of the IC for each of a set of design phases in forming the IC; testing the design of the IC for a failure mode in at least one of a set of failure modes; identifying a defined extraction parameter from the design of the IC for at least one failure mode in the set of failure modes in at least one design phase in the set of design phases; correlating the identified defined extracted parameter, each of the at least one failure mode, and the at least one design phase of the IC; and creating a normalized parameter equation representing the correlation of the identified defined extraction parameter, the at least one failure mode, and the at least one design phase of the IC in numerical form.

BRIEF DESCRIPTION OF THE FIGURES

These and other features of this invention will be more readily understood from the following detailed description of the various aspects of the invention taken in conjunction with the accompanying drawings that depict various embodiments of the invention, in which.

Figure 1:
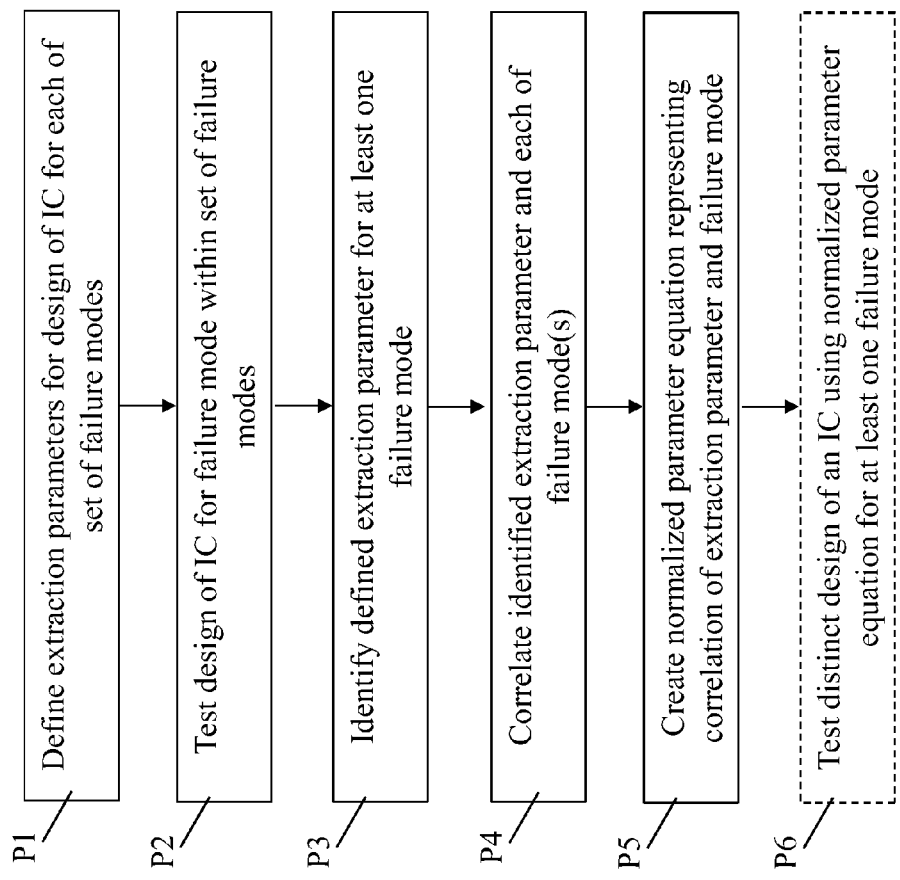
FIG. 1 shows a flow diagram illustrating a method performed according to particular embodiments of the disclosure.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As indicated above, the subject matter disclosed herein relates to integrated circuits (ICs). More particularly, the subject matter disclosed herein relates to design and analysis of integrate circuits.

As noted herein, normalizing test structure data and test condition data for an integrated circuit (IC) design is manually intensive, and can result in significant time delays in refining and building the IC from that design. In contrast to conventional approaches, various aspects of the disclosure include systems, computer program products and associated methods for automatically extracting design parameters (e.g., total run length of a given metal level, total number of vias, gate area, common run length, number of links, etc.) from an IC layout for analysis and test normalization. Approaches can include creating standards for parameter extraction which depend upon particular types of failure mode and/or particular phases in the design cycle of an IC (e.g., etch phase, lithography phase, deposition phase, etc.) Approaches further include defining code including a feature normalizing equation which replaces variables with values, which can be normalized. The resulting solution to the normalizing equation can be used to refine and/or verify the IC design.

In the following description, reference is made to the accompanying drawings that form a part thereof, and in which is shown by way of illustration specific example embodiments in which the present teachings may be practiced. These embodiments are described in sufficient detail to enable those skilled in the art to practice the present teachings and it is to be understood that other embodiments may be utilized and that changes may be made without departing from the scope of the present teachings.

Figure 3:
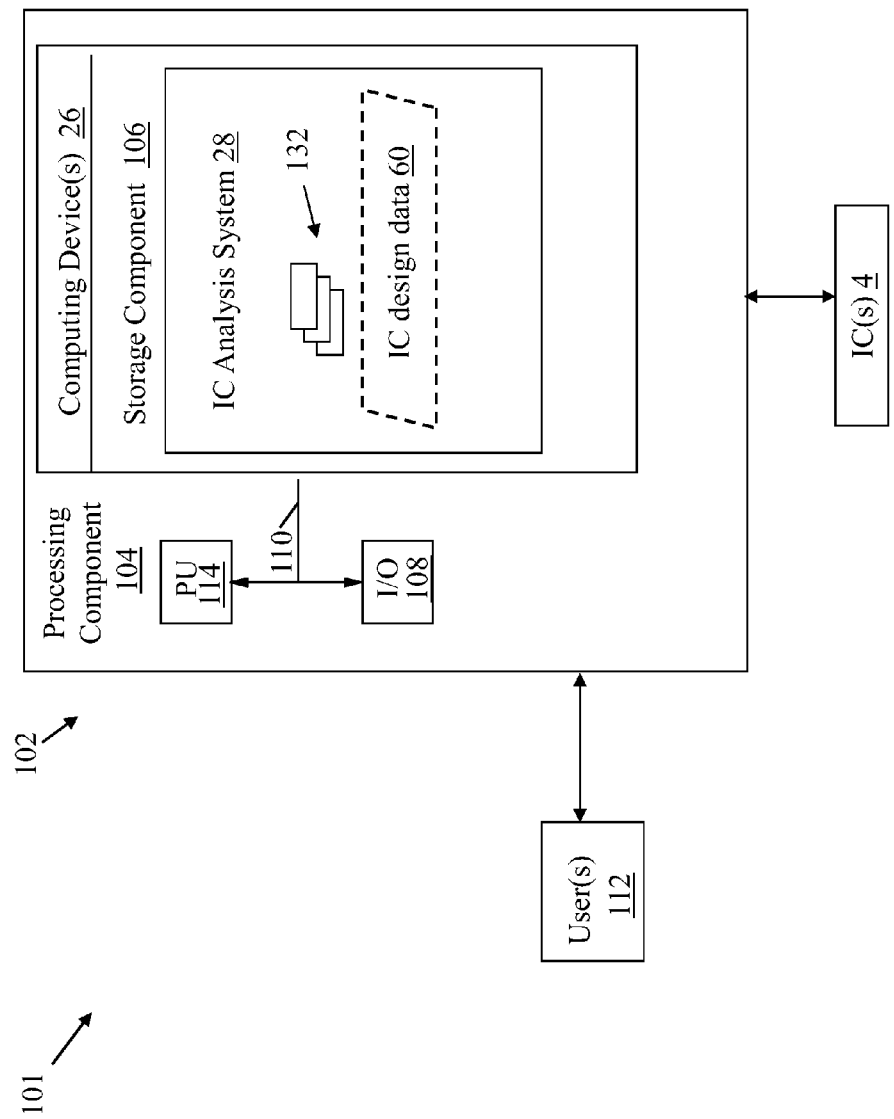
FIG. 3 shows an environment including a system for analyzing an integrated circuit, according to various embodiments of the disclosure.

FIG. 1 shows a flow diagram illustrating processes according to various embodiments of the disclosure. An integrated circuit (IC) analysis system 28 (FIG. 3) can perform various processes as described herein to analyze an IC design (or, layout). These processes are described in conjunction with IC analysis system 28 and data Turning to FIG. 1, processes according to various embodiments can include:

Process P1: defining extraction parameters for a design of an integrated circuit (IC) 4 for each of a set of failure modes. As shown in FIG. 3, a design of an IC can be represented by IC design data 60, which includes information about characteristics of components (e.g., vias, diodes, interconnects, lines, spacings, etc.) and relationships between components within a physical IC device (or simply, IC 4) (e.g., a memory device, transistor, etc.). It is understood that IC 4 can represent any of a number of IC devices, and that reference to a single IC is intended merely for simplicity of explanation. IC design data 60 can indicate a number of components within a given level of an IC 4, as well as distance (spacing) between components within a given level and between levels of IC 4. Extraction parameters can include parameters which indicate particular characteristics of IC 4 for each of a set of failure modes. In some cases, extraction parameters can include at least one of: a total run length of a metal level in an IC, a total number of vias in an IC, an area of a gate in an IC, a common run length in an IC, or a number of links in an IC. One or more extraction parameters may be relevant to a particular failure mode for IC 4, that is, a mechanism by which IC 4 is likely to fail (or, fail to achieve performance parameters such as reliability, current flow, timing, etc.). In some cases, the set of failure modes can include at least one of: a current leakage failure mode, an open circuit failure mode, or a parametric response failure (e.g., on simple resistors or field effect transistors (FETs). This process can include defining (designating) extraction parameters based upon their known relationship with particular failure mode(s), e.g., a total run length of a metal level can affect current leakage (e.g., current leakage failure mode). According to various embodiments, coding the extraction parameters for extraction can allow for reduced processing time (faster execution) when compared with conventional IC analysis, and in some cases, may reduce central processing unit (CPU) requirements (increasing efficiency) when compared with these conventional approaches;

Process P2: testing the design (IC design data 60) of IC 4 for a failure mode in the set of failure modes. This process can include running one or more simulations on IC design data 60 to determine whether the design fails according to a pre-determined failure mode for that test;

Process P3: identifying a defined extraction parameter from the design (design data 60) of IC 4 for at least one of the set of failure modes. This process can include identifying those defined extraction parameters (process P1) which are designated as corresponding with the failure mode(s) found in process P2;

Process P4: correlating the identified defined extracted parameter and each of the at least one failure mode for the design (design data 60) of IC 4. This process can include documenting (e.g., in program code, data storage, or other reproducible format) which defined extraction parameter(s) are correlated with failure mode(s) for the particular design of IC 4. This correlations process can include defining a variable-based mathematical relationship between the identified defined extraction parameter and each of the at least one failure mode. An example variable-based mathematical relationship is shown as:

$$0.841/I1/\text{Run Length} \qquad \text{(Equation 1)}$$

Where: 0.8 is the applied potential; I1 is the measured current (in amperes); and Run Length is one of the defined extraction parameters (in nanometers, or nm). The result of Equation 1 is a normalized Ohms/nanometer figure; and Process P5: creating a normalized parameter equation representing the correlation of the identified defined extraction parameter with the at least one failure mode for the design (design data 60) of IC 4 in numerical form. This process can include substituting the variable-based mathematical relationship with at least one numerical value, e.g., a normalized numerical range of values. Using the above-noted example of Equation 1, extraction parameter Run Length can have any numerical value as extracted from the design (IC design data 60). As such, for I1, the measured current is expected to modulate for a fixed 0.8 volt potential, staying within an approximately consistent range.

According to various embodiments, the above-noted process can further include an additional sub-process:

Process P6: testing a distinct design of an IC (e.g., IC design data 60 for a distinct IC) using the normalized parameter equation for at least one failure mode in the set of failure modes. In some cases, process P6 can be performed after processes P1-P5, and process P6 can be repeated for a plurality of distinct IC designs. That is, in some cases, process P6 can be performed as a stand-alone process after creation of the normalized parameter equation. In various embodiments, the normalized parameter equation can be codified (e.g., stored) and used to analyze various IC designs (e.g., IC design data).

Figure 2:
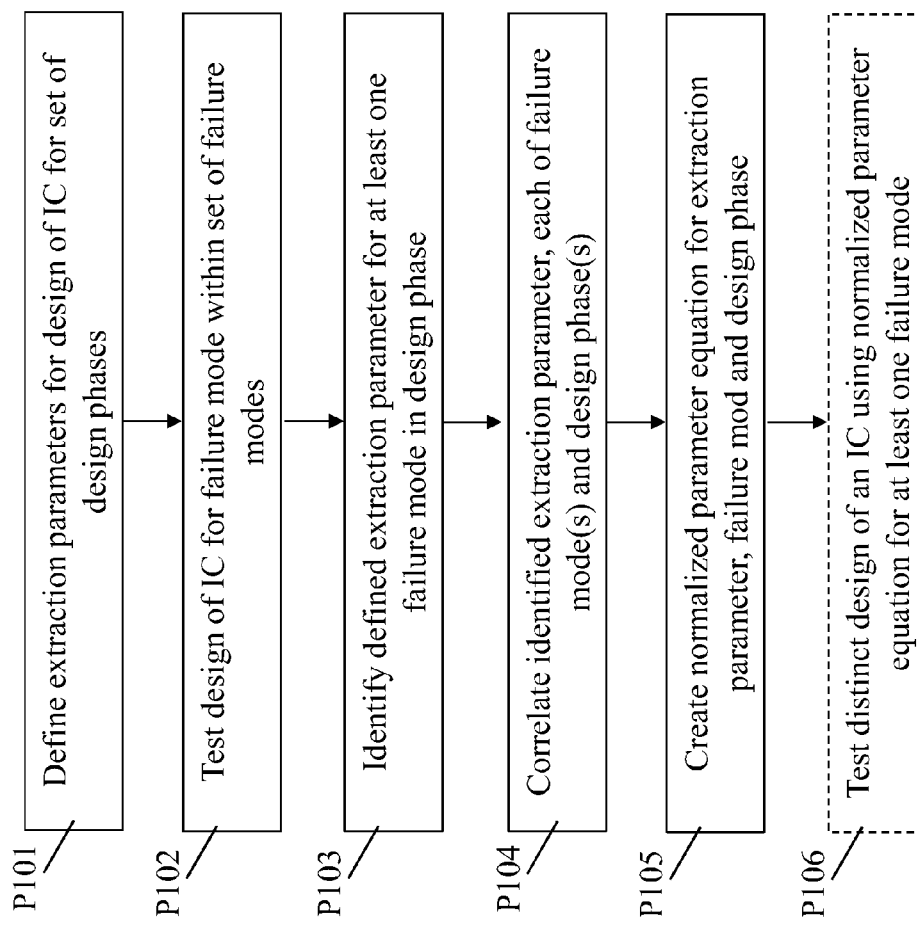
FIG. 2 shows a flow diagram illustrating a method performed according to additional particular embodiments of the disclosure.

According to various embodiments of the disclosure, as shown in the flow diagram of FIG. 2, an additional process can include:

Process P101: defining extraction parameters for a design of an integrated circuit (IC) 4 for each of a set of for each of a set of design phases in forming an IC (e.g., IC 4). Extraction parameters can include parameters which indicate particular characteristics of an IC for each of a set of design phases. In some cases, extraction parameters can include at least one of: a total run length of a metal level in an IC, a total number of vias in an IC, an area of a gate in an IC, a common run length in an IC, or a number of links in an IC. One or more extraction parameters may be relevant to a particular design phase for an IC, that is, extraction parameter(s) can have a particular effect on one or more design phases. In some cases, the set of failure modes can include at least one of: a current leakage failure mode, an open circuit failure mode, or a parametric response failure (e.g., on simple resistors or field effect transistors (FETs). In various embodiments, the set of design phases includes at least one of: an etch phase, a lithography phase, or a deposition phase in forming an IC. This process can include defining (designating) extraction parameters based upon their known relationship with particular design phases, e.g., a total run length of a metal level can affect the deposition and/or lithography phase;

Process P102: testing the design (IC design data 60) of IC 4 for a failure mode in a set of failure modes. This process can be performed substantially similarly as process P2 (FIG.

1), and include running one or more simulations on IC design data 60 to determine whether the design fails according to a pre-determined failure mode for that test;

Process P103: identifying a defined extraction parameter from the design (design data 60) of IC 4 for at least one of the set of failure modes in at least one design phase in the set of design phases. This process can include identifying those defined extraction parameters (process P101) which are designated as corresponding with the failure mode(s) found in process P102 in one or more design phases;

Process P104: correlating the identified defined extracted parameter, each of the at least one failure mode for the design (design data 60), and the at least one design phase of IC 4. This process can include documenting (e.g., in program code, data storage, or other reproducible format) which defined extraction parameter(s) are correlated with failure mode(s) and design phases for the particular design of IC 4. As noted herein, this correlation process can include defining a variable-based mathematical relationship between the identified defined extraction parameter, each of the at least one failure mode, and one or more of the design phases; and Process P105: creating a normalized parameter equation representing the correlation of the identified defined extraction parameter, the at least one failure mode for the design (design data 60) of IC 4, and the at least one design phase, in numerical form. As noted herein, this process can include substituting the variable-based mathematical relationship with at least one numerical value, e.g., a normalized numerical range of values.

According to various embodiments, the above-noted process can further include an additional sub-process:

Process P106: testing a distinct design of an IC (e.g., IC design data 60 for a distinct IC) using the normalized parameter equation for at least one failure mode in the set of failure modes. In some cases, process P106 can be performed after processes P101-P105, and process P106 can be repeated for a plurality of distinct IC designs. That is, in some cases, process P106 can be performed as a stand-alone process after creation of the normalized parameter equation. In various embodiments, the normalized parameter equation can be codified (e.g., stored) and used to analyze various IC designs (e.g., IC design data 60).

It is understood that in the flow diagrams shown and described herein, other processes may be performed while not being shown, and the order of processes can be rearranged according to various embodiments. Additionally, intermediate processes may be performed between one or more described processes. The flow of processes shown and described herein is not to be construed as limiting of the various embodiments.

FIG. 3 shows an illustrative environment 101 including IC analysis system 28, for performing the functions described herein according to various embodiments of the invention. To this extent, the environment 101 includes a computer system 102 that can perform one or more processes described herein in order to analyze an integrated circuit (e.g., IC design data 60 for forming an IC 4). In particular, the computer system 102 is shown as including the IC analysis system 28, which makes computer system 102 operable to analyze an IC (e.g., IC design data 60 for forming an IC 4) by performing any/all of the processes described herein and implementing any/all of the embodiments described herein.

The computer system 102 is shown including a computing device 26, which can include a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the IC analysis system 28, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human and/or computerized user) 112 to interact with the computer system 102 and/or one or more communications devices to enable the system user 112 to communicate with the computer system 102 using any type of communications link. To this extent, the IC analysis system 28 can manage a set of interfaces (e.g., graphical user interface(s), application program interface, etc.) that enable human and/or system users 112 to interact with the IC analysis system 28. Further, the IC analysis system 28 can manage (e.g., store, retrieve, create, manipulate, organize, present, etc.) data, such as IC design data 60 using any solution, e.g., via wireless and/or hardwired means.

In any event, the computer system 102 can comprise one or more general purpose computing articles of manufacture (e.g., computing devices) capable of executing program code, such as the IC analysis system 28, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the IC analysis system 28 can be embodied as any combination of system software and/or application software. It is further understood that the IC analysis system 28 can be implemented in a cloud-based computing environment, where one or more processes are performed at distinct computing devices (e.g., a plurality of computing devices 26), where one or more of those distinct computing devices may contain only some of the components shown and described with respect to the computing device 26 of FIG. 3.

Further, the IC analysis system 28 can be implemented using a set of modules 132. In this case, a module 132 can enable the computer system 102 to perform a set of tasks used by the IC analysis system 28, and can be separately developed and/or implemented apart from other portions of the IC analysis system 28. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of IC analysis system 28 fixed thereon (e.g., one or more modules 132). However, it is understood that the computer system 102 and IC analysis system 28 are only representative of various possible equivalent computer systems that may perform a process described herein. To this extent, in other embodiments, the functionality provided by the computer system 102 and IC analysis system 28 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices 26, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

While shown and described herein as a method and system for analyzing an IC (e.g., IC design data 60 for forming an IC 4), it is understood that aspects of the invention further provide various alternative embodiments. For example, in one embodiment, the invention provides a computer program fixed in at least one computer-readable medium, which when executed, enables a computer system to analyze an IC (e.g., IC design data 60 for forming an IC 4). To this extent, the computer-readable medium includes program code, such as the IC analysis system 28 (FIG. 3), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the IC analysis system 28 (FIG. 3), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of analyzing an IC (e.g., IC design data 60 for forming an IC 4). In this case, a computer system, such as the computer system 102 (FIG. 3), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

In any case, the technical effect of the various embodiments of the invention, including, e.g., the IC analysis system 28, is to analyze an IC (e.g., IC design data 60 for forming an IC 4). It is understood that according to various embodiments, the IC analysis system 28 could be implemented to analyze a plurality of ICs (e.g., IC design data 60 for forming one or more ICs), as described herein.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A system comprising:
   at least one computing device configured to analyze a design of an integrated circuit (IC) by performing actions including:
   defining extraction parameters for the design of the IC for each of a set of failure modes;
   testing the design of the IC for a failure mode in the set of failure modes;
   identifying a defined extraction parameter from the design of the IC for at least one of the set of failure modes;
   correlating the identified defined extracted parameter and each of the at least one failure mode for the design of the IC, wherein the correlating of the identified defined extraction parameter and each of the at least one failure mode includes defining a variable-based mathematical relationship between the identified defined extraction parameter and each of the at least one failure mode; and creating a normalized parameter equation representing the correlation of the identified defined extraction parameter with the at least one failure mode for the design of the IC in numerical form, wherein the creating of the normalized parameter equation in numerical form includes substituting the variable-based mathematical relationship with at least one numerical value.

2. The system of claim 1, wherein the at least one computing device is further configured to:

test a distinct design of an IC using the normalized parameter equation for at least one failure mode in the set of failure modes.

3. The system of claim 1, wherein the defined extraction parameter includes at least one of: a total run length of a metal level in the IC, a total number of vias in the IC, an area of a gate in the IC, a common run length in the IC, or a number of links in the IC.

4. The system of claim 1, wherein the set of failure modes includes at least one of: a current leakage failure mode, an open circuit failure mode, or a parametric response failure mode.

5. The system of claim 1, wherein the at least one numerical value includes a normalized numerical range.

6. The system of claim 1, wherein the testing of the design of the IC includes running at least one simulation on design data representative of the IC to determine whether the design fails according to the at least one failure mode for the test, wherein the design data represents a physical IC device.

7. A computer program product comprising program code stored on a non-transitory computer-readable medium, which when executed by at least one computing device, causes the at least one computing device to analyze a design of an integrated circuit (IC) by performing actions including:

defining extraction parameters for the design of the IC for each of a set of failure modes;

testing the design of the IC for a failure mode in the set of failure modes;

identifying a defined extraction parameter from the design of the IC for at least one of the set of failure modes;

correlating the identified defined extracted parameter and each of the at least one failure mode for the design of the IC, wherein the correlating of the identified defined extraction parameter and each of the at least one failure mode includes defining a variable-based mathematical relationship between the identified defined extraction parameter and each of the at least one failure mode; and creating a normalized parameter equation representing the correlation of the identified defined extraction parameter with the at least one failure mode for the design of the IC in numerical form, wherein the creating of the normalized parameter equation in numerical form includes substituting the variable-based mathematical relationship with at least one numerical value.

8. The computer program product of claim 7, wherein the program code stored on the non-transitory computer-readable medium causes the at least one computing device to test a distinct design of an IC using the normalized parameter equation for at least one failure mode in the set of failure modes.

9. The computer program product of claim 7, wherein the defined extraction parameter includes at least one of: a total run length of a metal level in the IC, a total number of vias in the IC, an area of a gate in the IC, a common run length in the IC, or a number of links in the IC.

10. The computer program product of claim 7, wherein the set of failure modes includes at least one of: a current leakage failure mode, an open circuit failure mode, or a parametric response failure mode.

11. The computer program product of claim 7, wherein the at least one numerical value includes a normalized numerical range.

12. The computer program product comprising program code stored on the non-transitory computer-readable medium of claim 7, wherein the testing of the design of the IC includes running at least one simulation on design data representative of the IC to determine whether the design fails according to the at least one failure mode for the test, wherein the design data represents a physical IC device.

13. A computer program product comprising program code stored on a non-transitory computer-readable medium, which when executed by at least one computing device, causes the at least one computing device to analyze a design of an integrated circuit (IC) by performing actions including:

defining extraction parameters for the design of the IC for each of a set of design phases in forming the IC;

testing the design of the IC for a failure mode in at least one of a set of failure modes;

identifying a defined extraction parameter from the design of the IC for at least one failure mode in the set of failure modes in at least one design phase in the set of design phases;

correlating the identified defined extracted parameter, each of the at least one failure mode, and the at least one design phase of the IC, wherein the correlating of the identified defined extraction parameter, the at least one failure mode and the at least one design phase includes defining a variable-based mathematical relationship between the identified defined extraction parameter, the at least one failure mode and the at least one design phase; and creating a normalized parameter equation representing the correlation of the identified defined extraction parameter, the at least one failure mode, and the at least one design phase of the IC in numerical form, wherein the creating of the normalized parameter equation in numerical form includes substituting the variable-based mathematical relationship with at least one numerical value.

14. The computer program product of claim 13, wherein the program code stored on the non-transitory computer-readable medium causes the at least one computing device to test a distinct design of an IC using the normalized parameter equation for at least one failure mode in the set of failure modes.

15. The computer program product of claim 13, wherein the defined extraction parameter includes at least one of: a total run length of a metal level in the IC, a total number of vias in the IC, an area of a gate in the IC, a common run length in the IC, or a number of links in the IC.

16. The computer program product of claim 13, wherein the set of failure modes includes at least one of: a current leakage failure mode, an open circuit failure mode, or a parametric response failure mode.

17. The computer program product of claim 13, wherein the set of design phases includes at least one of: an etch phase, a lithography phase, or a deposition phase.

18. The computer program product comprising program code stored on the non-transitory computer-readable medium of claim 13, wherein the testing of the design of the IC includes running at least one simulation on design data representative of the IC to determine whether the design fails according to the at least one failure mode for the test, wherein the design data represents a physical IC device.

* * * * *